(12) United States Patent
Ochi et al.

(10) Patent No.: US 8,956,558 B2
(45) Date of Patent: Feb. 17, 2015

(54) PASTE COMPOSITION FOR SOLAR CELL, METHOD FOR PRODUCING SAME, AND SOLAR CELL

(75) Inventors: Kosuke Ochi, Nagoya (JP); Masao Yamagishi, Nagoya (JP); Satoshi Tanaka, Osaka (JP); Yoshihiro Ohishi, Osaka (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 229 days.

(21) Appl. No.: 13/638,685

(22) PCT Filed: Mar. 29, 2011

(86) PCT No.: PCT/JP2011/057827
§ 371 (c)(1),
(2), (4) Date: Dec. 17, 2012

(87) PCT Pub. No.: WO2011/125655
PCT Pub. Date: Oct. 13, 2011

(65) Prior Publication Data
US 2013/0092880 A1 Apr. 18, 2013

(30) Foreign Application Priority Data
Apr. 2, 2010 (JP) ................ 2010-085889

(51) Int. Cl.
| H01B 1/00 | (2006.01) |
| H01B 1/02 | (2006.01) |
| H01B 1/12 | (2006.01) |
| H01B 1/22 | (2006.01) |
| H01B 1/08 | (2006.01) |
| H01B 1/04 | (2006.01) |
| H01B 1/06 | (2006.01) |
| H01M 6/04 | (2006.01) |
| H01L 31/00 | (2006.01) |
| H01L 31/0224 | (2006.01) |
| H01L 31/068 | (2012.01) |
| B82Y 30/00 | (2011.01) |
| H01L 31/18 | (2006.01) |

(52) U.S. Cl.
CPC .......... *H01L 31/022425* (2013.01); *H01B 1/22* (2013.01); *H01L 31/068* (2013.01); *B82Y 30/00* (2013.01); *H01L 31/18* (2013.01); *Y10S 977/773* (2013.01); *Y02E 10/547* (2013.01)

USPC ............... 252/520.22; 252/500; 252/501.1; 252/512; 252/518.1; 252/519.31; 252/520.2; 252/521.3; 429/209; 436/252; 977/773

(58) Field of Classification Search
None
See application file for complete search history.

(56) References Cited

U.S. PATENT DOCUMENTS

| 6,548,168 B1 * | 4/2003 | Mulvaney et al. ............ 428/402 |
| 7,368,657 B2 | 5/2008 | Watsuji et al. |
| 2004/0055635 A1 | 3/2004 | Nagakubo et al. |
| 2006/0231804 A1 * | 10/2006 | Wang et al. ................... 252/500 |
| 2006/0272700 A1 | 12/2006 | Young et al. |
| 2007/0079868 A1 | 4/2007 | Rose et al. |
| 2009/0095344 A1 | 4/2009 | Machida et al. |
| 2009/0223563 A1 | 9/2009 | Lai et al. |
| 2009/0255583 A1 | 10/2009 | Young et al. |
| 2009/0301553 A1 * | 12/2009 | Konno et al. .................. 136/252 |
| 2012/0067417 A1 | 3/2012 | Machida et al. |

FOREIGN PATENT DOCUMENTS

| CN | 1487531 A | 4/2004 |
| CN | 101000935 A | 7/2007 |
| CN | 101292363 A | 10/2008 |
| JP | A-2007-96040 | 4/2007 |
| JP | B2-3910072 | 4/2007 |
| JP | A-2007-294678 | 11/2007 |
| WO | WO 2009/009512 A1 | 1/2009 |

OTHER PUBLICATIONS

Nov. 7, 2013 Extended European Search Report issued in European Application No. 11765555.5.
Nov. 13, 2012 International Preliminary Report on Patentability issued in International Application No. PCT/JP2011/057827.
Jul. 5, 2011 International Search Report issued in International Application No. PCT/JP2011/057827 (with translation).

* cited by examiner

*Primary Examiner* — Harold Pyon
*Assistant Examiner* — Tanisha Diggs
(74) *Attorney, Agent, or Firm* — Oliff PLC (57) ABSTRACT

A paste composition for forming a back surface electrode of a solar cell 10 provided by the present invention contains, as solid matter, an aluminum powder, a glass powder, and a composite powder composed of a granular composite material of titanium oxide and an organic or inorganic compound containing silicon. When the total amount of the composite powder, the aluminum powder, and the glass powder is 100% by mass, the composite powder is contained in a ratio of 0.45% by mass or more and 1% by mass or less.

7 Claims, 2 Drawing Sheets

Prior Art

PASTE COMPOSITION FOR SOLAR CELL, METHOD FOR PRODUCING SAME, AND SOLAR CELL

This is an application filed under 35 U.S.C. 371 of PCT/JP2011/057827, filed Mar. 29, 2011, which claims priority from Japan Patent Application 2010-085889, filed Apr. 2, 2010, the disclosure of which is incorporated herein in its entirety.

TECHNICAL FIELD

The present invention relates to a paste composition for a solar cell and a method for producing the same. More specifically, the present invention relates to an aluminum-containing paste composition for forming an aluminum electrode (as a back surface electrode) on the back surface side of a light-receiving surface of a crystalline silicon solar cell, and a method for producing the same.

Note that the present application claims priority based on Japanese Patent Application No. 2010-085889 filed on Apr. 2, 2010, and the entire content of the Japanese Patent Application is incorporated herein by reference.

BACKGROUND ART

As a typical example of a solar cell which converts solar light energy into power, there is known a solar cell which uses crystalline silicon (single-crystalline or polycrystalline) as a semiconductor substrate, a so-called crystalline silicon solar cell. As such a crystalline silicon solar cell, there is known, e.g., a single-side light receiving solar cell 10 shown in FIG. 2.

Figure 2:
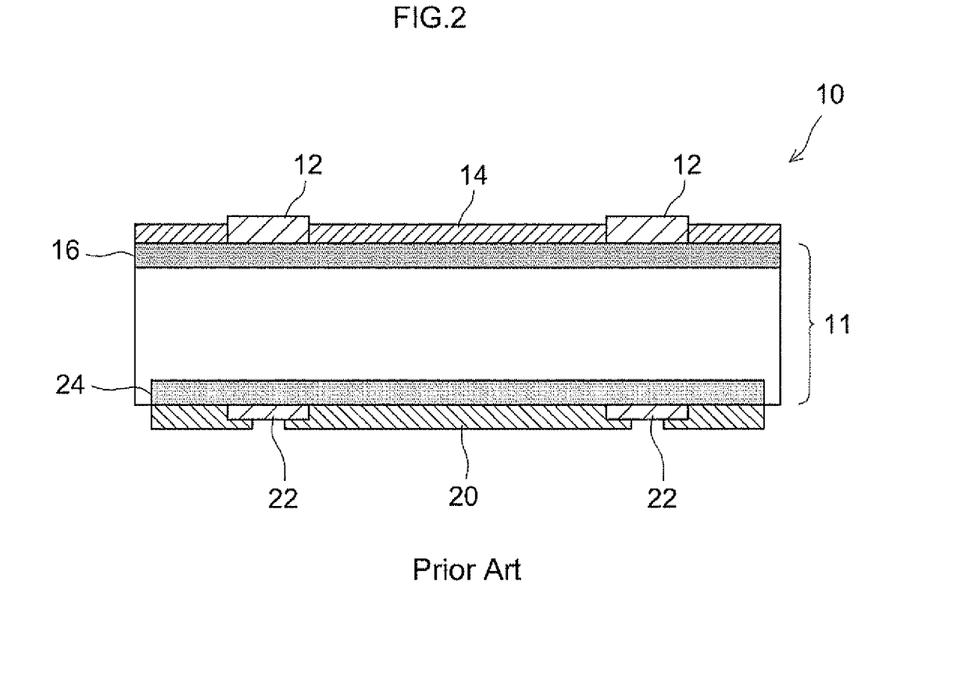
FIG. 2 is a cross-sectional view schematically showing an example of a structure of a conventional solar cell.

The solar cell 10 has an n-Si layer 16 formed on the light-receiving surface side of a p-type silicon substrate (Si wafer: p-Si layer made of p-type crystalline silicon) 11 by pn junction formation, and has, on the surface of the n-Si layer 16, a reflection prevention film 14 made of titanium oxide or silicon nitride which is formed by CVD or the like and front surface electrodes (light-receiving surface electrodes) 12 made of Ag which are formed typically by screen-printing and firing a silver paste. On the other hand, on the back surface side of the p-type silicon substrate (p-Si layer) 11, the solar cell 10 has back surface external connection electrodes 22 made of Ag which are formed by screen-printing and firing the silver paste similarly to the case of the front surface electrodes 12, and an aluminum electrode 20 which exhibits a so-called back surface field (BSF) effect.

Such an aluminum electrode 20 is formed on a substantially entire surface of the back surface by printing and firing an aluminum paste composed mainly of an aluminum powder. An Al—Si alloy layer (not shown) is formed during the firing, and aluminum is diffused into the p-type silicon substrate (p-Si layer) 11 and a p⁺ layer 24 is formed. Such a p⁺ layer 24, i.e., a BSF layer is formed, whereby photogenerated carriers are prevented form being re-coupled in the vicinity of the back surface electrode and an improvement in, e.g., open-circuit voltage or short-circuit current (Isc) is achieved.

Incidentally, in order to effectively realize the BSF effect, the aluminum electrode 20 needs to be formed so as to have a certain film thickness (e.g., 30 to 60 μm). On the other hand, for the reason of a reduction in the production cost of the solar cell or a reduction in the size of the solar cell module, the p-type silicon substrate (Si wafer) 11 thinner than conventional substrates, i.e., a reduction in the thickness of the solar cell element itself is requested.

However, the reduction in the thickness of the substrate (Si wafer) 11 encourages the occurrence of deformation such as warpage or bend in the silicon substrate (wafer) itself during firing for forming the aluminum electrode 20 by a difference in thermal expansion coefficient between the substrate 11 itself and the aluminum electrode 20. Accordingly, various countermeasures for preventing the occurrence of deformation such as the warpage or the like are conventionally taken.

For example, Patent Literature 1 proposes an aluminum-containing paste composition for forming an impurity layer or an electrode layer on a p-type silicon semiconductor substrate which contains silicon oxide or aluminum oxide.

CITATION LIST

Patent literature

Patent Literature 1: Japanese Patent Publication No. 3910072

SUMMARY OF INVENTION

In recent years, in a case where a wafer of which thickness is reduced is used, it is requested to further improve solar cell characteristics while reducing warpage to a level lower than in conventional cases and maintaining an excellent appearance.

The present invention has been achieved in view of the above-described point, and an object thereof is to provide a paste composition for forming a film-shaped aluminum electrode capable of reducing a warpage degree (warpage amount) and maintaining an excellent appearance. In addition, another object thereof is to provide a method for producing such a paste composition. Further, still another object thereof is to provide a solar cell provided with a back surface electrode formed by using such a paste composition.

In order to achieve the above-described objects, a paste composition provided by the present invention is a paste composition for forming a back surface electrode of a solar cell. The paste composition contains, as solid matter, an aluminum powder, a glass powder, and a composite powder composed of a granular composite material of titanium oxide and an organic or inorganic compound containing silicon. The composite powder is contained in a ratio of 0.45% by mass or more and 1% by mass or less when the total amount of the composite powder, the aluminum powder, and the glass powder is assumed to be 100% by mass.

The composite powder is contained in the paste composition according to the present invention at the content mentioned above, and hence, when a substrate (e.g., an Si substrate) on which the paste composition is provided is fired and a back surface electrode is thereby formed, the warpage of the substrate is effectively suppressed and the occurrence of a foreign object such as a blister or the like on the back surface electrode is also suitably suppressed. In addition, even when such a paste composition contains the composite powder, solar cell characteristics (e.g., a short-circuit current Isc) of a solar cell provided with the back surface electrode (film) obtained by using the paste composition can be maintained at a high level.

Consequently, according to the paste composition for forming the back surface electrode of the present invention, it is possible to realize the solar cell in which the warpage of the substrate is suppressed and which has excellent solar cell characteristics and an excellent appearance.

In a preferred aspect of the paste composition disclosed herein, the composite powder is titanium oxide, at least a part of a surface of which is coated with the organic or inorganic compound containing silicon.

According to the paste composition containing the composite powder composed of the composite material (particle) in such a state, it is possible to realize the solar cell in which the effect of preventing the warpage of the substrate, the effect of suppressing the occurrence of the foreign object, and the solar cell characteristics described above are further improved.

In a preferred aspect of the paste composition disclosed herein, an average particle diameter of the composite powder is 1 nm or more and 10 nm or less.

According to the paste composition containing the composite powder composed of the particle having such a size, the dense back surface electrode capable of suppressing the occurrence of the foreign object and maintaining high conductivity is formed so that it is possible to realize the excellent solar cell having excellent solar cell characteristics.

In a preferred aspect of the paste composition disclosed herein, the solid matter is contained in a ratio of 60% by mass or more and 80% by mass or less relative to the entire paste composition including a liquid medium.

The paste composition containing the solid matter at such a content is easily and uniformly (typically in a film-like shape) provided on the substrate and, by firing the substrate on which the paste composition is provided, it is possible to form the back surface electrode (film) having an excellent appearance on the substrate.

Consequently, according to the present invention, by forming the back surface electrode by using any one of the paste compositions disclosed herein, it is possible to suitably realize the solar cell which achieves the above-described effects.

Further, the present invention provides, as another aspect, a method for producing a solar cell. This method forms a back surface electrode on a substrate by providing any one of the paste compositions disclosed herein on the substrate and firing the paste composition. Typically, the producing method disclosed herein includes: preparing a paste composition which contains, as solid matter, an aluminum powder, a glass powder, and a composite powder composed of a granular composite material of titanium oxide and an organic or inorganic compound containing silicon, and which contains the composite powder in a ratio of 0.45% by mass or more and 1% by mass or less when a total amount of the composite powder, the aluminum powder, and the glass powder is 100% by mass; providing on a substrate the paste composition; and firing the paste composition provided on the substrate and forming the back surface electrode on the substrate.

By using the producing method of the present invention, there is suitably provided a solar cell which has an excellent appearance by preventing the warpage of the substrate and suppressing the occurrence of the foreign object, and has excellent solar cell characteristics (e.g., the high short-circuit current).

In a preferred aspect of the producing method disclosed herein, the firing is performed at a firing temperature of 600° C. or more and 900° C. or less.

By firing the paste composition provided on the substrate under such a temperature condition, it is possible to form the back surface electrode having an excellent appearance resulting from preventing the warpage of the substrate and suppressing the occurrence of the foreign object.

DESCRIPTION OF EMBODIMENTS

Hereinbelow, a preferred embodiment of the present invention is described. Note that a matter other than the subject specifically referred to in the present description, but necessary to carry out the present invention (for example, a method for mixing material powders (solid matter) of a paste composition with a liquid medium, a method for providing the paste composition on a substrate, or the like) may be understood as a design matter for a person skilled in the art on the basis of a related art in the pertinent field. The present invention can be carried out on the basis of the content disclosed in the present description and common general technical knowledge in the pertinent field.

Figure 1:
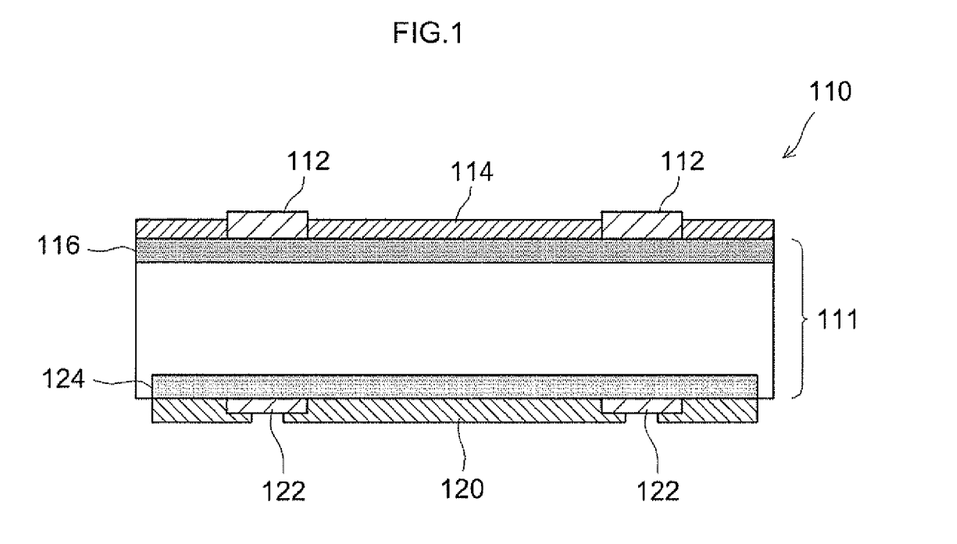
FIG. 1 is a cross-sectional view schematically showing a structure of a solar cell according to an embodiment of the present invention.

Although the structure of a solar cell according to an embodiment which is produced by using a paste composition disclosed herein is schematically shown in FIG. 1, the structure itself of a solar cell 110 shown in FIG. 1 is the same as that of a conventional solar cell 10 shown in FIG. 2, there is no difference between the structures thereof, and the structures thereof are shown in similar cross-sectional views. That is, as shown in the drawing, the solar cell 110 according to the present embodiment has an n-Si layer 116 formed by pn junction formation on a light-receiving surface side of a p-type silicon substrate (Si wafer: p-Si layer made of p-type crystalline silicon) 111, and includes, on the surface of the n-Si layer 116, a reflection prevention film 114 and front surface electrodes (light-receiving surface electrodes) 112 made of Ag. On the other hand, on the back surface side of the p-type silicon substrate (p-Si layer) 111, the solar cell 110 includes back surface external connection electrodes 122 made of Ag and an aluminum electrode 120 exhibiting a so-called BSF effect.

The past composition disclosed herein is a paste composition for forming a back surface electrode which is used for the purpose of forming the aluminum electrode as a back surface electrode in the solar cell. Such a paste composition contains, as solid matter, an aluminum powder, a glass powder, and a composite powder composed of a granular composite material of titanium oxide and an organic or inorganic compound containing silicon, and the paste composition contains the composite powder in a ratio of 0.45% by mass or more and 1% by mass or less when the total amount of the composite powder, the aluminum powder, and the glass powder is assumed to be 100% by mass. Consequently, as long as the objects of the present invention are achieved, there is no particular limit on other constituent components or compounding amounts (ratio) thereof.

The aluminum power contained in the paste composition disclosed herein as the main solid matter is an aggregate of particles mainly made of aluminum (Al), and is typically an aggregate of particles made of Al alone. However, even when such an aluminum powder contains a trace amount of an impurity other than Al or an alloy (particle) mainly made of Al, if the aluminum powder is an aggregate of particles mainly made of Al as a whole, the aluminum powder can be included in the "aluminum powder" mentioned herein. Note that such an aluminum powder may be an aluminum powder produced by a conventionally known producing method, and special producing means is not required.

The shape of the particle constituting such an aluminum powder is not particularly limited. The shape thereof is typically spherical, but is not limited to a so-called pearl-like shape. Other than the spherical shape, examples of the shape thereof include a flake-like shape and an irregular shape. Such an aluminum powder may also be composed of particles having the various shapes. When such an aluminum powder is composed of particles having a small average particle diameter (e.g., a size of several μm), 70% by mass or more of the particles (primary particles) preferably have the spherical shape or a shape similar to the spherical shape. For example, the aluminum powder which has 70% by mass or more of the particles constituting the aluminum powder having an aspect ratio (i.e., a ratio of a long diameter of the particle to a short diameter thereof) of 1 to 1.5 is preferable.

Herein, when the aluminum electrode as the back surface electrode is formed on one surface (typically the back surface side of the light-receiving surface) of the substrate (e.g., an Si substrate) constituting the solar cell, in a state of a dried coating film (i.e., a dried aluminum film) before firing, the film thickness thereof is preferably 100 μm or less, more preferably 80 μm or less, further preferably 60 μm or less, and preferably, e.g., 40 μm±10 μm.

With regard to the aluminum powder which is suitable for forming the dried coating film having the film thickness mentioned above, the average particle diameter of the particle constituting the powder is suitably 20 μm or less, preferably 1 μm or more and 10 μm or less, more preferably 2 μm or more and 8 μm or less, and, e.g., 5 μm±1 μm. The average particle diameter mentioned herein denotes a particle diameter when the cumulative volume in a particle size distribution of the powder is 50%, i.e., D50 (median diameter). Such D50 can be easily measured by a particle size distribution measurement apparatus based on laser diffractometry (that is, the particle size distribution is determined by a dispersion pattern when laser light is applied to a measurement sample and thereby dispersed).

For example, it is also possible to use an aluminum (mixed) powder which is obtained by mixing a plurality (typically two types) of aluminum powders having different average particle diameters (e.g., the difference in average particle size is within a range of 3 μm or more and 7 μm or less) and has the average particle diameter within the above-mentioned range. By using the aluminum powder having the average particle diameter described above, it is possible to form the dense aluminum electrode suitable as the back surface electrode.

The content of the above-described aluminum powder in the paste composition disclosed herein is not particularly limited, and it is preferable to adjust the content of the aluminum powder such that the content thereof corresponds to 60% by mass or more and 80% by mass or less (more preferably 65% by mass or more and 80% by mass or less and, e.g., 70% by mass or more and 80% by mass or less) when the entire paste composition is assumed to be 100% by mass. When the content of the aluminum powder in the produced paste composition falls within the above-described range, it is possible to form the aluminum electrode (film) having improved density.

The glass powder (typically a glass frit) contained as a sub-component among the solid matter in the paste composition disclosed herein is an inorganic additive which improves a bonding strength to the substrate constituting the aluminum electrode as the back surface electrode of the solar cell. As such a glass powder, a glass powder having a relatively high thermal expansion coefficient which is close to the thermal expansion coefficient of aluminum is preferable. Examples of the glass include a zinc, borosilicate, or alkaline glass, a glass containing barium oxide or bismuth oxide, or a combination of two or more of these. As a specific example, a glass powder including a glass having the following oxide as a main component, i.e., a $B_2O_3$—$SiO_2$—$ZnO$ glass, a $R_2O$— $ZnO$—$SiO_2$—$B_2O_3$ glass (herein, $R_2O$ is alkaline metal oxide), a $RO$—$ZnO$—$SiO_2$—$B_2O_3$ glass (herein, RO is alkaline earth metal oxide), a $Bi_2O_3$—$B_2O_3$—$ZnO$ glass, or a $B_2O_3$—$SiO_2$—$Bi_2O_3$ glass is preferable. In order to stably fire and fix (attach by firing) the paste composition (the coating film) provided on the substrate (e.g., the Si substrate), as the suitable glass frit contained in the paste composition, the glass frit having a specific surface area of about 0.5 $m^2/g$ or more and 50 $m^2/g$ or less is preferable, and the glass fit having an average particle diameter of 2 μm or less (particularly about 1 μm or less) is suitable.

In addition, the content of such a glass powder in the paste composition is not particularly limited, and the amount thereof corresponding to about 0.5% by mass or more and 5% by mass or less (preferably 0.5% by mass or more and 3% by mass or less and more preferably 1% by mass or more and 3% by mass or less) relative to the entire paste composition is suitable.

Next, a description is given of the composite powder by which the paste composition disclosed herein is characterized.

The composite powder is a component contained as the solid matter of the paste composition together with the aluminum powder and the glass powder. Such a composite powder is composed of a granular composite material of titanium oxide and an organic or inorganic compound containing silicon (i.e., the composite powder is an aggregate of the granular composite material).

As such a granular composite material (composite particle), a titanium oxide particle in a state where a part of the surface thereof is coated with the organic or inorganic compound containing silicon is preferable. Such a composite material is not limited to a composite material in which the surface of a primary particle of titanium oxide is coated with the organic or inorganic compound containing silicon or a composite material in which the surface of a secondary particle (a particle obtained by flocculating two or more primary particles) of titanium oxide is coated with the organic or inorganic compound containing silicon. However, when consideration is given to that aluminum particles in the paste composition are arranged adjacent to each other via the composite particle, the composite material in which the surface of the primary particle is coated is more preferable. The average particle diameter of the composite particle constituting the composite powder is suitably 1 nm or more and 10 nm or less, preferably 2 nm or more and 8 nm or less, and more preferably 4 nm or more and 7 nm or less.

As titanium oxide (typically titanium dioxide ($TiO_2$)) constituting the composite material, there can be used a particle produced by a conventionally known method such as, e.g., a so-called sulfuric acid method in which hydrous titanium dioxide obtained by hydrolyzing a titanium sulfate solution is fired or a so-called chlorine method in which titanium halide is subjected to vapor phase oxidation. In addition, there may also be used a colloid (sol) containing a titanium dioxide particle obtained by, e.g., a sol-gel method which uses titanium tetraisopropoxide (TTIP) as a starting material. The crystal form of titanium dioxide obtained in the manner described above may be an anatase type or a rutile type, and a mixture in which anatase-type titanium dioxide and rutile type titanium oxide are mixed may also be used.

The organic or inorganic compound containing silicon (hereinafter each compound is sometimes collectively referred to as a "silicon-containing compound") in the state of silicon dioxide ($SiO_2$) may coat the surface of titanium oxide in advance to constitute the composite material, or may be the one which is finally brought into the state of $SiO_2$ by being oxidized (at least a part or typically the substantially entire silicon-containing compound coating the surface being oxidized) in a stage where the paste composition is fired and the aluminum electrode is formed. As such a silicon-containing compound, a silicon-containing compound capable of achieving decomposition of the composite material at a temperature lower than the melting point of aluminum of 660° C. (e.g., 250° C. or more and 600° C. or less) is preferable. Herein, when the paste composition containing the composite material is fired and the aluminum electrode is thereby formed, there is a possibility that the bulky composite material which can be locally present abnormally reacts with aluminum to cause a foreign object to occur with the composite material functioning as a nucleus. However, due to the decomposition temperature of the composite material described above, the composite material can be easily decomposed before the abnormal reaction with aluminum occurs, and hence the formation of the nucleus of the foreign object and the occurrence of the foreign object are adequately prevented and, as a result, the aluminum electrode having an excellent appearance without the foreign object can be formed.

The composite powder composed of the titanium oxide particle of which the surface is coated with the silicon-containing compound can be obtained by, e.g., methods shown below. An example thereof includes a method in which the titanium dioxide particle and the silicon-containing compound are wet-pulverized (or wet-crushed) together with a predetermined liquid medium in a stirring mill (medium stirring mill) or the like, and the liquid medium is removed by drying them. In addition, the example thereof also includes a method in which the silicon-containing compound (typically prepared in a solution) is sprayed (blown) using an air spray or the like while a titanium oxide powder is stirred. Examples of the silicon-containing compound used in such methods include an organic silicon compound, typically an organic silane compound, especially alkoxysilane, specifically methyltrimethoxysilane, dimethyldimethoxysilane, methyltriethoxysilane, dimethyldiethoxysilane, n-propyl trimethoxysilane, isobutyltrimethoxysilane, hexyltrimethoxysilane, hexyltriethoxysilane, octyltriethoxysilane, and decyltrimethoxysilane. As other organic silicon compounds, various silane coupling agents can also be used. Further, as another example of the method for producing the composite powder, there may also be used a method in which the silicon-containing compound is added to a water dispersion (or a slurry) in which the titanium oxide powder (particle) is dispersed in a water-based liquid medium (water-based medium) or a water-based medium containing a gel of titanium oxide under a predetermined pH (e.g., alkaline), and the composite (the composite material) is then precipitated through neutralization. In a case where the composite material is produced by using such methods, it is possible to use the composite material before being precipitated through the neutralization (typically the composite material in the fluid dispersion or the slurry) when the paste composition is prepared. As a result, the composite material can be used before the composite material is powdered, and hence the composite material can be efficiently used. Herein, as the silicon-containing compound used in such methods, a water-soluble silicon-containing compound is suitable, and examples thereof include an alkaline metal salt of silica (alkaline silicate) and a silica sol. As alkaline silicate, it is possible to use alkaline metal salts (typically sodium salts) of orthosilicic acid ($H_2SiO_4$), metasilicic acid ($H_2SiO_3$), and bisilicic acid ($H_2SiO_5$), typically the alkaline metal salt of metasilicic acid, and especially a water glass as a thick aqueous solution thereof (typically a thick aqueous solution of sodium silicate ($Na_2O.SiO_2$)). Note that the water dispersion or the water-based medium containing the sol may contain various additives for improving stability or dispersibility other than the silicon-containing compound.

The composite powder produced by the above-described methods is preferably contained in the paste composition in a ratio of 0.45% by mass or more and 1.5% by mass or less when the total amount of the composite powder, the aluminum powder, and the glass powder (i.e., the mass of the solid matter contained in the paste composition disclosed herein) is assumed to be 100% by mass. The composite powder is contained more preferably in a ratio of 0.45% by mass or more and 1.2% by mass or less and especially preferably in a ratio of 0.45% by mass or more and 1% by mass or less. By using the paste composition in which the composite powder is contained in this ratio, it is possible to form the back surface electrode (the solar cell) in which the poor appearance resulting from the warpage of the substrate and the occurrence of the foreign object on the aluminum electrode is improved and solar cell characteristics such as the short-circuit current (Isc) and the like are excellent. For example, the solar cell provided with such a back surface electrode can reduce the warpage amount of the substrate by 12.5% or more as compared with the case where the composite powder is not added. In addition, the solar cell described above can exhibit the high short-circuit current value exceeding 8.0 A.

In a case where the ratio of the composite powder relative to the solid matter is significantly smaller than 0.45% by mass, the effect of suppressing the warpage of the substrate cannot be effectively exerted, and it is difficult to maintain the short-circuit current at a high level. On the other hand, in a case where the ratio of the composite powder relative to the solid matter significantly exceeds 1% by mass, the effect of suppressing the warpage of the substrate can be significantly exerted, but the solar cell characteristics such as, e.g., the open-circuit voltage (Voc) and the like are lowered in addition to the short-circuit current so that the solar cell characteristics can be adversely affected.

Herein, in a case where the ratio of the composite powder relative to the solid matter is 0.45% by mass or more and 1% by mass or less, it is possible to reduce the warpage amount of the substrate by 10% or more as compared with the case where the composite powder is not added, and hence the case is preferable. In addition, in a case where the ratio of the composite powder relative to the solid matter is 0.56% by mass or more, it is possible to reduce the warpage amount of the substrate by 20% or more, and hence the case is further preferable. Further, in a case where the ratio of the composite powder relative to the solid matter is 0.45% by mass or more and 1% by mass or less, the short-circuit current value can be increased to be 8.0 A or higher, and hence the case is preferable.

The paste composition disclosed herein contains, as the solid matter, the aluminum powder, the glass powder, and the composite powder described above, and also contains a liquid medium for dispersing the solid matter. The ratio of the solid matter relative to the entire paste composition, i.e., the content of the solid matter in the paste composition is suitably 50% by mass or more and 90% by mass or less, preferably 60% by mass or more and 80% by mass or less, and more preferably 65% by mass or more and 75% by mass or less when the entire paste composition including the solid matter and the liquid medium is assumed to be 100% by mass. The paste composition containing the solid matter of this content can be easily provided (coated) as the aluminum electrode (film) on the substrate with a uniform thickness so that the paste composition can be easily handled, and the paste composition can be suitably dried without requiring a long time period in a drying step before the aluminum electrode film is fired. Therefore, the past composition is preferable.

The liquid medium in which the solid matter in the paste composition disclosed herein is dispersed is typically an organic medium (carrier). An organic solvent constituting such a carrier may be any organic solvent as long as it can excellently disperse the solid matter (powder), particularly the aluminum powder, and the organic solvent used in this type of the conventional paste can be used without particular limitation. For example, as the solvent constituting the carrier, it is possible to use high-boiling organic solvents such as ethylene glycol and diethylene glycol derivatives (glycol ether solvents), toluene, xylene, butyl carbitol (BC), and terpineol alone or in combination of a plurality thereof.

In addition, as an organic binder constituting the carrier, various resin components can be contained. Such a resin component may be any resin component as long as the resin component can impart excellent viscosity and coating film formation capability (adhesion to the substrate) to the paste composition, and the resin component used in this type of the conventional paste can be used without particular limitation. Examples of the resin component include resin components mainly containing acrylic resin, epoxy resin, phenolic resin, alkyd resin, cellulose-based polymer, polyvinyl alcohol, and rosin resin. Among them, the cellulose-based polymer such as ethyl cellulose or the like is preferable. In addition, the content of the organic carrier is suitably 10% by mass or more and 50% by mass or less relative to the entire paste composition, preferably 20% by mass or more and 40% by mass or less, and more preferably 25% by mass or more and 35% by mass or less, though the content thereof is not particularly limited. Further, the organic binder contained in the organic carrier is preferably contained in a ratio of 1% by mass or more and 5% by mass or less relative to the entire paste composition (more preferably in a ratio of 1% by mass or more and 3% by mass or less).

Similarly to the conventional aluminum paste for the solar cell, the paste composition disclosed herein can be easily prepared typically by mixing the aluminum powder, the glass powder, the composite powder, and the organic carrier. For example, the aluminum powder, the glass powder, and the composite powder at a predetermined mixing ratio may appropriately be mixed and stirred together with the organic carrier at a predetermined compounding ratio by using a three-roll mill or other kneaders.

Note that, when the composite powder is mixed with other constituent components (components), the composite powder may be provided in the form of the fluid dispersion or the slurry composition (hereinafter sometimes simply referred to a "slurry") in which the composite powder is dispersed in the liquid medium such as, e.g., a water-based solvent or alcohols in advance.

The paste composition disclosed herein can be handled in the same manner as the aluminum paste conventionally used for forming the aluminum electrode (by extension the $p^+$ layer, i.e., the BSF layer) as the back surface electrode on the substrate is handled, and conventionally known methods can be used without particular limitation. Typically, by a screen printing method, a dispenser coating method, and a dip coating method, the paste composition is provided (coated) on the substrate so as to have a desired film thickness (as described above, e.g., 30 μm or less) and a coating pattern. As such a substrate, a silicon (Si) substrate is suitable, and the substrate is typically an Si wafer. The thickness of such a substrate can be set in consideration of the desired size of the solar cell, the film thickness of the aluminum electrode formed on the substrate, and the strength of the substrate (e.g., a breaking strength). The thickness of the substrate is suitably 100 μm or more and 300 μm or less, preferably 150 μm or more and 250 μm or less, and, e.g., 160 μm or more and 200 μm or less.

Next, a paste coating object is dried at an appropriate temperature (e.g., a temperature higher than room temperature, and typically about 100° C.). After the drying, the firing of the dried coating film is performed by heating the dried coating film for a predetermined time period in an appropriate firing furnace (e.g., a high-speed firing furnace) under an appropriate heating condition (e.g., 600° C. or more and 900° C. or less and preferably 700° C. or more and 800° C. or less). With this, the paste coating object is attached onto the substrate by firing, and the aluminum electrode 120 shown in FIG. 1 is formed. Normally, the aluminum electrode 120 is fired and the $p^+$ layer (the BSF layer) 124 can also be formed, as described above. That is, the aluminum electrode 120 as the back surface electrode is formed on the p-type silicon substrate 111 (containing the composite powder) by the firing, and the $p^+$ layer 124 containing aluminum as the impurity is formed by the dispersion of aluminum atoms into the substrate 111.

As described above, the paste composition disclosed herein contains the composite powder composed of the granular composite material of the organic or inorganic compound containing silicon (the silicon-containing compound) and titanium oxide. As a result, the composite particle is present between the aluminum particles, and hence, even when the paste composition is provided (coated) on the substrate and fired, excessive aggregation and sintering of the aluminum particles can be suppressed. Consequently, a difference in thermal expansion (shrinkage) between the substrate and the paste coating object (the aluminum electrode) is reduced and, as a result, it is possible to suppress and prevent the deformation of the substrate such as the warpage or the like and the occurrence of the foreign object on the aluminum electrode formed by the firing. In addition, the aluminum electrode obtained by using such a paste composition contains the composite particles, but can maintain excellent conduction between the aluminum particles. Consequently, according to such a paste composition, it is possible to realize the excellent solar cell having excellent solar cell characteristics (e.g., a high short-circuit current of 8.0 A or higher).

Note that the material and process for producing the solar cell other than the formation of the aluminum electrode (the back surface electrode) by using the paste composition disclosed herein may be the same as the conventional material and process. It is possible to produce the solar cell (typically a crystalline silicon solar cell) provided with the back surface electrode formed by using the paste composition without performing a special procedure. A typical example of the structure of such a crystalline silicon solar cell includes the structure shown in FIG. 1. In the process after the formation of the aluminum electrode, for example, after the $n^+$ layer 116 and the reflection prevention film 114 are formed similarly to the conventional case, a conventional paste composition mainly made of silver (a silver paste) is printed in a desired region on the back surface by screen printing and dried, and the silver paste is also printed into a pattern shape on the light-receiving surface and dried. Thereafter, the aluminum paste is printed and dried so as to be overlapped on a part of the silver paste formation region on the back surface, and the firing is performed. In this manner, the solar cell (element) 110 is formed.

Hereinbelow, Examples of the present invention are described, but the present invention is not intended to be limited to Examples shown below.

EXAMPLE 1

Preparation of Paste Composition (1)

(1) As the aluminum powder, an aluminum powder having an average particle diameter (D50) of 5 μm was prepared.

(2) As the glass powder, a glass frit made of a zinc ($B_2O_3$—$SiO_2$—ZnO) glass (a glass frit prepared at a compounding ratio of $B_2O_3$: 36 mol %, $SiO_2$: 29 mol %, ZnO: 8 mol %, $Al_2O_3$: 4 mol %, SrO: 10 mol %, and BaO: 13 mol %) was prepared.

(3) The composite powder (an additive) was prepared by the following procedures.

1) Commercially available titanium tetrachloride was prepared, titanium dioxide obtained by performing vapor phase oxidation on titanium tetrachloride was pulverized, and a titanium dioxide ($TiO_2$) powder having a predetermined average particle diameter was obtained. Next, by dispersing the obtained titanium dioxide powder into water, a water-based slurry having a titanium dioxide concentration of 300 g/L was prepared. Subsequently, the pH of the water-based slurry was set to 10.5 by adding an aqueous sodium hydroxide solution having a predetermined concentration to the water-based slurry, and ultrasonic dispersion was then performed for 30 minutes. Then, the temperature of the slurry was increased to 70° C. or more and 80° C. or less while stirring the slurry in an amount of 4000 ml, and an aqueous solution (150 g/l on an $SiO_2$ basis) in an amount of 320 ml obtained by diluting a water glass (water glass No. 3 defined by HS K1408) with water was added under the temperature condition. Thereafter, the stirring was continuously performed for about 30 minutes and the slurry and the aqueous solution were well mixed. Next, after the temperature of the slurry was increased to a temperature of 90° C. or more and less than 100° C. at which boiling does not occur, sulfuric acid in an amount of 2 mol/L was added for 60 minutes at a rate of about 1 ml/minute, and the slurry was neutralized until the pH thereof became 5. Thereafter, in a state where the temperature condition of 70° C. was maintained, the slurry was aged for 60 minutes while being stirred. The aged slurry was filtered, washed with water, wet-pulverized in a ball mill, and then dried under a predetermined temperature condition, whereby a composite powder (an additive) having an average particle diameter of 6 nm and composed of titanium dioxide of which the surface was coated with the silicon-containing compound was obtained.

2) Next, the obtained composite powder (the additive) in an amount of 16 g was added together with separately prepared isobutyltrimethoxysilane in an amount of 4 g to isopropyl alcohol in an amount of 80 g, zirconia beads each having a diameter of 0.5 mm in an amount of 250 g was further added, and a dispersion process was performed for 240 minutes in a paint conditioner (#5110 type by Red Devil, Inc.). Thereafter, the zirconia beads were removed, and the fluid dispersion or the slurry composition (hereinafter sometimes simply referred to as "composite slurry") containing the composite powder (the additive) in a ratio of 16% by mass was obtained.

3) On the obtained composite slurry described above, thermogravimetry (TG) was performed. As a result, the weight was reduced in a range of 250° C. to 600° C. The weight change is expected to be caused by the decomposition of the silicon-containing compound coating the surface of the titanium dioxide particle.

4) Next, the prepared aluminum powder and glass powder, and the composite slurry obtained in 2) of (3) described above are kneaded with the organic carrier composed of the binder (ethyl cellulose) and the organic solvent (terpineol), and a paste composition was thereby obtained. Herein, with regard to the compounding ratio of the aluminum powder and the glass powder contained in the obtained paste composition, when the entire paste composition is assumed to be 100% by mass, the aluminum powder in a ratio of 70% by mass and the glass powder in a ratio of 1% by mass were prepared. In addition, with regard to the compounding ratio of the composite powder (the additive), the compounding ratio was calculated as a ratio relative to the total amount of the composite powder (the additive), the aluminum powder, and the glass powder (i.e., the total mass of the solid matter), and nine types of paste compositions which have different ratios of the composite powder (the additive) relative to the solid matter were prepared. These paste compositions were designated as Samples 2 to 10. The correlations between Samples 2 to 10 and the ratio of the composite powder (the additive) (hereinafter sometimes simply referred to as "$TiO_2$—Si") relative to the solid matter were shown in Table 1.

Herein, in such paste compositions (Samples 2 to 10), the portion obtained by subtracting the ratio of the solid matter (i.e., the aluminum powder, the glass powder, and the composite powder (the additive)) from 100% by mass corresponds to the ratio (compounding ratio) of the liquid components. In the breakdown of the liquid components, the binder has a ratio of 1.5% by mass (relative to the entire paste composition), and the organic solvent occupies the remaining portion. In addition, isobutyltrimethoxysilane and isopropyl alcohol contained in the composite slurry are assumed to be contained as the liquid components, and the preparation is made such that the portion obtained by subtracting the two components and the binder from the liquid components corresponds to the ratio (compounding ratio) of the organic solvent contained in the paste composition.

EXAMPLE 2

Preparation of Paste Composition (2)

Next, a paste composition was prepared by the same procedures as those in the preparation method of the paste composition shown in Example 1 except that the composite powder (the additive) was not added. The paste composition was designated as Sample 1.

EXAMPLE 3

Calculation of Warpage Amount

A solar cell was produced by using each of the obtained paste compositions of Samples 1 to 10 as the paste composition for forming the aluminum electrode.

Specifically, a commercially available p-type single-crystalline silicon substrate for the solar cell having a size of 156 mm square (plate thickness of 180 μm) was prepared, and the surface of the substrate was subjected to acid etching by using mixed acid of hydrofluric acid and nitric acid.

Next, a phosphorus-containing solution was applied to the light-receiving surface of the silicon substrate formed with a fine roughness structure by the etching and a thermal process was performed on the light-receiving surface thereof, whereby an n-Si layer ($n^+$ layer) having a thickness of about 0.5 μm was formed on the light-receiving surface of the silicon substrate (see FIG. 1).

Subsequently, a reflection prevention film (silicon nitride film) having a thickness of about 80 nm was formed on the n-Si layer by a plasma CVD (PECVD) method. In addition, after a coating film (having a thickness of 10 μm or more and 30 μm or less) serving as a front surface electrode (Ag electrode) was formed on the reflection prevention film by a screen printing method by using a predetermined silver paste for forming the front surface electrode (Ag electrode), a coating film serving as the back surface electrode (Ag electrode) was similarly formed into a pattern shape and dried (see FIG. 1).

The paste composition of each of Samples 1 to 10 was printed (coated) so as to be overlapped on a part of the Ag electrode on the back surface side of the silicon substrate by screen printing (a screen mesh made of stainless steel SUS #165 was used. The same applies to the following.), and a coating film having a film thickness of about 55 μm was formed. Then, by firing the silicon substrate, the aluminum electrode (the back surface electrode) was formed. Specifically, the silicon substrate was fired at a firing temperature of about 700° C. or more and 800° C. or less by using a near infrared high-speed firing furnace in an air atmosphere. Herein, the firing was carried out under the condition of an air atmosphere of 2 m/s by using a walking beam (WB) type firing furnace in a state where the aluminum electrode surface of the silicon substrate was faced upward.

Next, the warpage amount of the silicon substrate after the firing was examined. That is, the silicon substrate after the firing was disposed on a horizontal test board such that the surface formed with the aluminum electrode was faced upward, and the dimension between the lowest part and the highest part in the thickness direction of the silicon substrate was measured. The measurement value was used as the warpage amount (mm) in the present Example. The result of the measurement is shown in the corresponding section of Table 1. The target of the warpage amount herein was set to a value less than 3.0 mm.

EXAMPLE 4

Evaluation of Appearance of Aluminum Electrode

In addition, it was visually observed whether or not the foreign object such as a blister or the like occurred on the surface of the aluminum electrode formed after the firing. The result of the observation is shown in the corresponding section of Table 1. In the section, "x" was given to Sample in which the foreign object occurred while "o" was given to Sample in which the foreign object did not occur.

As shown in Table 1, in Sample 1 in which the composite powder (the additive) (strictly the composite slurry) was not added, the warpage amount of the substrate was 3.2 mm, and the occurrence of the foreign object on the aluminum electrode formed by using Sample 1 was observed.

In contrast to this, in each of Samples 2 to 10 in which the composite powder (the additive) ($TiO_2$—Si) was added, the warpage amount of the substrate was lowered. In addition, the occurrence of the foreign object on the aluminum electrode was not observed, but the blister (swell) occurred only in Sample 10.

Further, in each of Samples 2 to 10, as the ratio of the composite powder (the additive) relative to the solid matter is increased, the warpage amount of the substrate was reduced. In particular, in each of Samples 4 to 10 in which the ratio of the composite powder (the additive) relative to the solid matter was in a range of 0.45% by mass or more, the warpage amount of the substrate became 2.8 mm or less, and was lower by 10% or more than that in Sample 1 (the warpage amount was 3.2 mm). Furthermore, the warpage amount in Sample 5 in which the ratio thereof was 0.5% by mass or more was 2.5 mm, and was lower by 20% or more than that in Sample 1. Moreover, the warpage amount in Sample 10 in which the ratio thereof was 1.0% by mass was 2.3 mm, and was lower by about 30% than that in Sample 1.

EXAMPLE 5

Measurement of Electric Characteristics

In the present Example, by screen-printing a silver paste for forming the back surface electrode (the Ag electrode) similar to the silver paste for forming the front surface electrode (the Ag electrode) on the back surface side of each silicon substrate formed with the front surface electrode (the Ag electrode) in Example 5 into a predetermined pattern and drying the silver paste, a back surface Ag coating object having a thickness of 20 μm or more and 50 μm or less was formed (i.e., the back surface external connection electrode made of Ag after the firing: see FIG. 1).

Next, the paste composition of each of Samples 1 to 10 was printed (coated) by screen printing, and a coating film having a film thickness of about 55 μm was formed. Subsequently, the silicon substrate was fired at a firing temperature of 700° C. or more and 800° C. or less by using the near infrared high-speed firing furnace in an air atmosphere. By such firing, the aluminum electrode (the back surface electrode) was formed together with the front surface electrode (the Ag electrode) and the back surface external connection Ag electrode. Then, solar cell characteristics were measured according to a method described in JIS C 8913, The result of the measurement is shown in the corresponding section of Table 1. At this point, the target of the short-circuit current (Isc) was set to 8.0 A or higher which was higher than the current value, and the target of a conversion efficiency (EFF) was set to 15.0% or more.

As shown in Table 1, in the solar cell provided with the aluminum electrode formed by using Sample 1 in which the composite powder (the additive) was not added (hereinbelow simply referred to as the "solar cell of Sample 1". The same applies to Samples 2 to 10.), the short-circuit current value was 7.950 A.

In each of the solar cells of Samples 4 to 8, it was confirmed that the excellent short-circuit current value which was higher than that in Sample 1 and not less than 8.0 A was exhibited and excellent solar cell characteristics could be achieved. In particular, in the solar cell of Sample 6, the high short-circuit current value exceeding 8.1 A was exhibited. On the other hand, in each of the solar cells of Samples 2 and 3 in which the composite powder (the additive) was added in a ratio of less than 0.45% by mass relative to the solid matter, the short-circuit current value was 8.0 A or lower and was substantially equal to the value in Sample 1. In addition, in each of the solar cells of Samples 9 and 10 in which the composite powder (the additive) was added in a ratio of 1.5% by mass relative to the solid matter, an improvement in short-circuit current value was observed.

The result in the present Example is related to the solar cell obtained by firing the silicon substrate in the walking beam (WB) furnace similarly to Example 3.

On the other hand, the similar measurement was carried out on the solar cell obtained by firing the silicon substrate in a commonly used continuous belt furnace. As a result, in the solar cell in which the composite powder (the additive) was not added, the short-circuit current value (Isc) was 7925 mA and the open-circuit voltage (Voc) was 610 mV. In contrast to this, in the solar cell in which the composite powder (the additive) was added in a ratio of 0.45% by mass, the short-circuit current value was 7997 mA and the open-circuit voltage was 610 mV. In the solar cell in which the composite powder (the additive) was added in a ratio of 1.5% by mass, the short-circuit current value was 7980 mA and the open-circuit voltage was 604 mV. That is, even when the silicon substrate was fired in the continuous belt furnace, an improvement in short-circuit current value by the addition of the composite powder (the additive) was observed.

EXAMPLE 6

Evaluation of Peel Strength

After an adhesive cellophane tape manufactured by NICHIBAN CO.,LTD. (CT-15153P) was pressed against the surface of the aluminum electrode of each of Samples 1 to 10 with fingers, the tape was peeled and the color of the electrode on the tape surface was visually observed. Three-grade evaluation of the result of the observation is shown in the corresponding section of Table 1. The three-grade evaluation was performed based on whether or not the surface of the pressed tape was in a state equal to that before the peeling. That is, "o" in Table indicates a state where no electrode is adhered to the substantially entire surface of the pressed tape, "Δ" indicates a state where the electrode is partially adhered to the pressed tape, and "x" indicates a state where the electrode is adhered to the substantially entire surface of the pressed tape.

powder (the additive) in correspondence to the added amount so that the shape at the Al/Si interface (the formation of roughness) becomes mild and the reflection of incident light at the interface is increased.

Consequently, according to the paste composition for forming the back surface electrode of the present invention, it is possible to realize the solar cell in which the warpage of the substrate is prevented and which has excellent solar cell characteristics and an excellent appearance.

INDUSTRIAL APPLICABILITY

The present invention provides a paste composition for forming a back surface electrode which contains an aluminum, a glass powder, and a composite powder composed of a granular composite material of titanium oxide and an organic or inorganic compound containing silicon, and contains the composite powder in a ratio of 0.45% by mass or more and 1% by mass or less when the total amount of the composite powder, the aluminum powder, and the glass powder is assumed to be 100% by mass. By forming the back surface electrode of a solar cell by using such a paste composition, it is possible to realize the solar cell in which the warpage of a substrate is prevented and which has an excellent appearance and excellent solar cell characteristics (e.g., a high short-circuit current).

REFERENCE SIGNS LIST 10 solar cell
11 p-type silicon substrate (Si wafer)

TABLE 1

| No. | Additive/ Solid Matter [% by Mass] | Isc [mA] | Increase Rate of Isc | Voc [mV] | FF | Pm [W] | EFF [%] | Warpage Amount [mm] | Appearance[1] | Peel Strength[2] |
|---|---|---|---|---|---|---|---|---|---|---|
| 1 | None | 7945 |  | 610 | 0.750 | 3.63 | 14.9 | 3.2 | x | o |
| 2 | 0.14 | 7937 | 0.999 | 610 | 0.748 | 3.62 | 14.9 | 3.1 | o | o |
| 3 | 0.34 | 7953 | 1.001 | 609 | 0.750 | 3.63 | 14.9 | 3.1 | o | o |
| 4 | 0.45 | 8017 | 1.009 | 610 | 0.760 | 3.72 | 15.3 | 2.8 | o | o |
| 5 | 0.56 | 8064 | 1.015 | 610 | 0.763 | 3.75 | 15.4 | 2.5 | o | o |
| 6 | 0.64 | 8104 | 1.020 | 611 | 0.762 | 3.77 | 15.5 | 2.4 | o | o |
| 7 | 0.80 | 8064 | 1.015 | 610 | 0.756 | 3.72 | 15.3 | 2.3 | o | o |
| 8 | 1.00 | 8024 | 1.010 | 609 | 0.761 | 3.72 | 15.3 | 2.2 | o | o |
| 9 | 1.50 | 8009 | 1.008 | 609 | 0.745 | 3.63 | 14.9 | 1.9 | o | Δ |
| 10 | 2.00 | 7969 | 1.003 | 607 | 0.748 | 3.62 | 14.9 | 1.7 | x | x |

Average Value When n = 3
[1]Two-Grade Evaluation using o and x
[2]Three-Grade Evaluation using o, Δ, and x Consequently, according to the paste composition of the present Example, the composite powder (the additive) composed of titanium oxide and the silicon-containing compound was contained in a ratio of 0.45% by mass or more and 1% by mass or less relative to the solid matter. As a result, even when the silicon substrate on which the paste composition was coated was fired, it was confirmed that the warpage amount of the substrate was significantly reduced, such warpage was effectively suppressed, and the occurrence of the foreign object on the aluminum electrode (the back surface electrode) formed by the firing was suitably suppressed. In addition, it was confirmed that, even when such a paste composition contained the composite powder (the additive), the solar cell characteristics (the short-circuit current Isc) of the solar cell provided with such an aluminum electrode were maintained at a high level (e.g., Isc exceeded 8.0 A). This is because, in rapid alloying reaction at an Al/Si interface during the firing, the alloying reaction is relieved by adding the composite 12 front surface electrode (light-receiving surface electrode)
14 reflection prevention film
16 n-Si layer (n$^+$ layer)
20 aluminum electrode (back surface electrode)
22 back surface external connection electrode
24 p$^+$ layer
110 solar cell
111 p-type silicon substrate (Si wafer)
112 front surface electrode (light-receiving surface electrode)
114 reflection prevention film
116 n-Si layer (n$^+$ layer)
120 aluminum electrode (back surface electrode) (containing composite powder)
122 back surface external connection electrode
124 p$^+$ layer

The invention claimed is:
1. A paste composition for forming a back surface electrode of a solar cell, the composition comprising:

an aluminum powder;

a glass powder; and a composite powder composed of a granular composite material of titanium oxide and an organic or inorganic compound containing silicon as solid matter, wherein when a total amount of the composite powder, the aluminum powder, and the glass powder is 100% by mass, the composite powder is contained in a ratio of 0.45% by mass or more and 1% by mass or less.

2. The paste composition according to claim 1, wherein the composite powder is titanium oxide, at least a part of a surface of which is coated with the organic or inorganic compound containing silicon.

3. The paste composition according to claim 1, wherein an average particle diameter of the composite powder is 1 nm or more and 10 nm or less.

4. The paste composition according to claim 1, wherein the solid matter is contained in a ratio of 60% by mass or more and 80% by mass or less relative to the entire paste composition including a liquid medium.

5. A method for producing a solar cell provided with an aluminum electrode as a back surface electrode, the method comprising:

preparing a paste composition which contains, as solid matter, an aluminum powder, a glass powder, and a composite powder composed of a granular composite material of titanium oxide and an organic or inorganic compound containing silicon, and which contains the composite powder in a ratio of 0.45% by mass or more and 1% by mass or less when a total amount of the composite powder, the aluminum powder, and the glass powder is 100% by mass;

providing on a substrate the paste composition; and firing the paste composition provided on the substrate and forming the back surface electrode on the substrate.

6. The producing method according to claim 5, wherein the firing is performed at a firing temperature of 600° C. or more and 900° C. or less.

7. A solar cell comprising a back surface electrode formed by using the paste composition according to claim 1.

* * * * *